United States Patent
Chang et al.

(10) Patent No.: US 10,347,695 B2
(45) Date of Patent: Jul. 9, 2019

(54) DISPLAY PANEL

(71) Applicant: HON HAI PRECISION INDUSTRY CO., LTD., New Taipei (TW)

(72) Inventors: Wei-Chih Chang, New Taipei (TW); Chung-Wen Lai, New Taipei (TW); Hsin-Hua Lin, New Taipei (TW); Kuo-Sheng Lee, New Taipei (TW); Kuan-Hsien Jiang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/919,289

(22) Filed: Mar. 13, 2018

(65) Prior Publication Data
US 2018/0275457 A1 Sep. 27, 2018

Related U.S. Application Data

(60) Provisional application No. 62/474,639, filed on Mar. 22, 2017.

(51) Int. Cl.
*H01L 27/12* (2006.01)
*H01L 27/32* (2006.01)
*G02F 1/1335* (2006.01)
*G02F 1/1362* (2006.01)
*G02F 1/1368* (2006.01)

(52) U.S. Cl.
CPC ........ *H01L 27/3218* (2013.01); *G02F 1/1368* (2013.01); *G02F 1/133514* (2013.01); *G02F 1/136286* (2013.01); *H01L 27/124* (2013.01); *H01L 27/3213* (2013.01); *H01L 27/3216* (2013.01); *G02F 2201/123* (2013.01)

(58) Field of Classification Search
CPC ............ G02F 1/133514; G02F 1/1368; G02F 1/136286; G02F 2201/123; G02F 1/133512; G02F 1/136209; G02F 1/13473; G02F 1/133371; G02F 2001/136222; G02F 2001/136218; H01L 27/3213; H01L 27/124; H01J 11/44; H01J 2211/444; H01J 2329/323; H01J 29/327
USPC .................................................. 349/106–111
See application file for complete search history.

(56) References Cited

U.S. PATENT DOCUMENTS

| | | | | |
|---|---|---|---|---|
| 2005/0068477 | A1* | 3/2005 | Shin | G02F 1/133514 349/106 |
| 2006/0262251 | A1* | 11/2006 | Kim | G02F 1/133514 349/106 |
| 2007/0091043 | A1* | 4/2007 | Rho | G02F 1/133514 345/88 |
| 2008/0049048 | A1* | 2/2008 | Credelle | G09G 3/2074 345/690 |
| 2015/0109565 | A1* | 4/2015 | Takeda | G02F 1/134309 349/106 |
| 2015/0144945 | A1* | 5/2015 | Kusunoki | H01L 27/124 257/43 |
| 2015/0234243 | A1* | 8/2015 | Oono | G02F 1/133514 349/106 |

(Continued)

*Primary Examiner* — Shan Liu
(74) *Attorney, Agent, or Firm* — ScienBiziP, P.C.

(57) ABSTRACT

A display panel composed of red, green, blue, and white subpixels which avoids imaging artifacts is provided. The display panel defines a plurality of pixel units. Each pixel unit includes a complete red sub-pixel, a complete green sub-pixel, and a half-sized blue sub-pixel, and a half-sized white sub-pixel.

8 Claims, 6 Drawing Sheets

(56) References Cited

U.S. PATENT DOCUMENTS

| | | | |
|---|---|---|---|
| 2016/0155397 A1* | 6/2016 | Yang | G09G 3/3607 |
| | | | 345/87 |
| 2016/0155776 A1* | 6/2016 | Kabe | H01L 27/3216 |
| | | | 257/89 |
| 2016/0196780 A1* | 7/2016 | Chu-Ke | G09G 3/2003 |
| | | | 345/88 |
| 2016/0203778 A1 | 7/2016 | Matsui et al. | |
| 2017/0061846 A1* | 3/2017 | Yao | G09G 3/2003 |
| 2017/0261819 A1* | 9/2017 | Kim | G02F 1/133514 |

* cited by examiner

DISPLAY PANEL

FIELD

The subject matter herein generally relates to a display panel.

BACKGROUND

Figure 6:
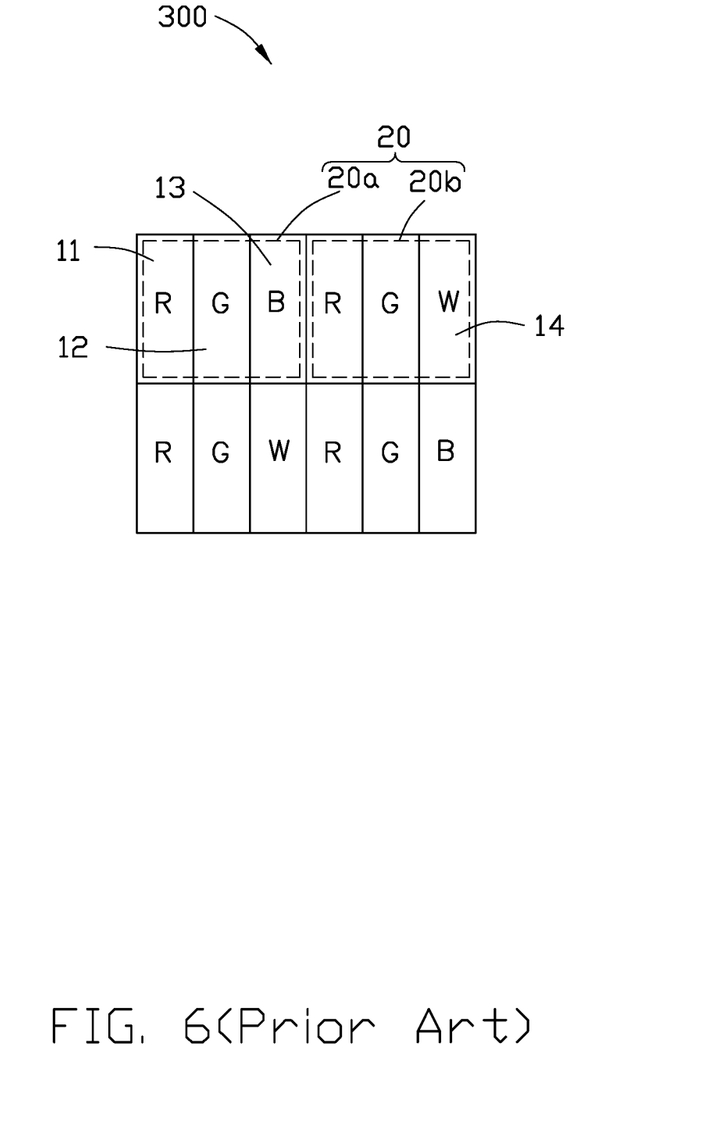
FIG. 6 is a plan view showing a layout of sub-pixels of a conventional display panel.

Referring to FIG. 6, a conventional display device 300 includes four types of sub-pixels emitting different colors. There is a plurality of red sub-pixels 11, a plurality of green sub-pixels 12, a plurality of blue sub-pixels 13, and a plurality of white sub-pixels 14, wherein ratio of the complete red sub-pixels 11, the complete green sub-pixels 12, the blue sub-pixels 13 and the complete white sub-pixels 14 is 2:2:1:1. The display device 300 defines a plurality of pixel units 20. Each pixel unit 20 includes three sub-pixels each of which emitting a different color. The pixel unit 20 includes two different types. One kind of pixel unit 20a includes one red sub-pixel 11, one green sub-pixel 12, and one blue sub-pixel 13 arranged adjacent to each other. The other kind of pixel unit 20b includes one red sub-pixel 11, one green sub-pixel 12, and one complete white sub-pixel 14 arranged adjacent to each other. The pixel units 20a and the pixel units 20b are alternately arranged in a same row and in a same column. However, image artifacts may be introduced due to the poor symmetry between the blue sub-pixel 13 and the white sub-pixel 14 in adjacent pixel units 20. Therefore, there is room for improvement in the art.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising" when utilized, means "including, but not necessarily limited to"; it specifically indicates open-ended inclusion or membership in the so-described combination, group, series, and the like.

First Embodiment

Figure 1:
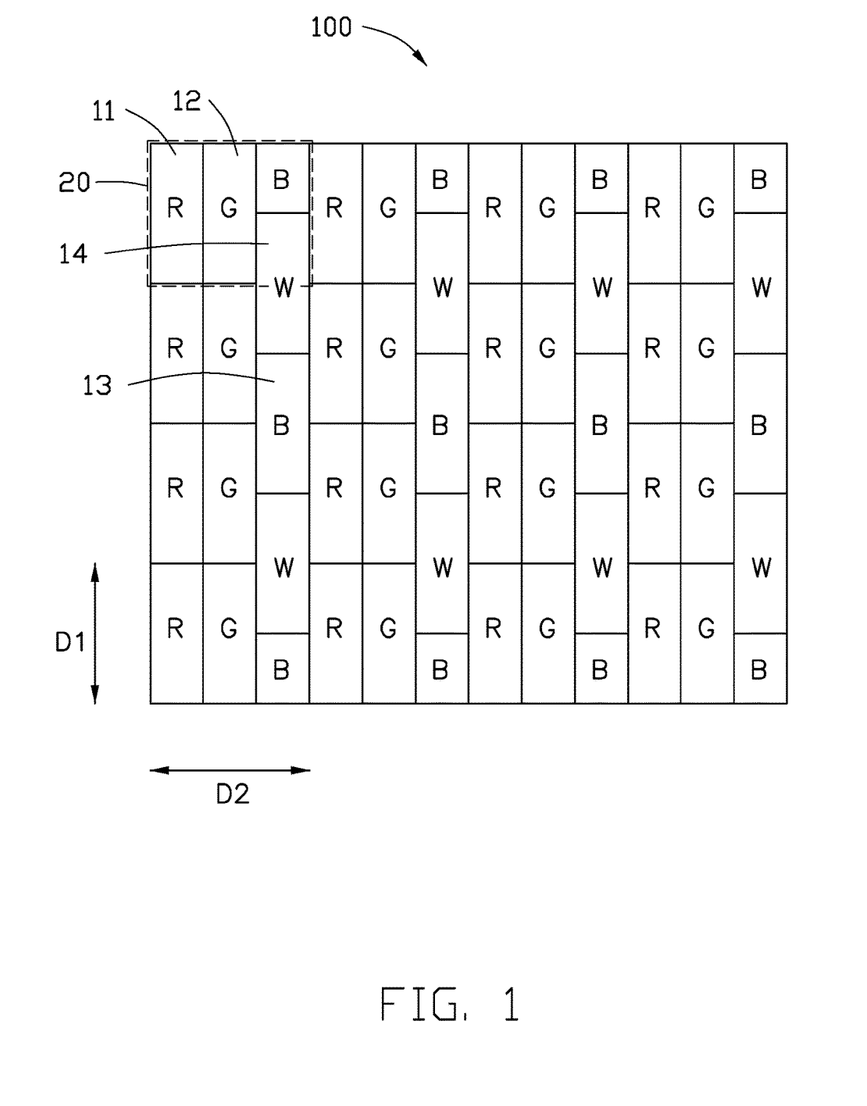
FIG. 1 is a plan view showing a layout of sub-pixels of a display panel according to a first embodiment.

FIG. 1 illustrates a display panel 100 according to a first embodiment. The display panel 100 has a substantially rectangular shape, and defines a plurality of red sub-pixels 11, a plurality of green sub-pixels 12, a plurality of blue sub-pixels 13, and a plurality of white sub-pixels 14. A total number of the complete red sub-pixels 11 is equal to a total number of the complete green sub-pixels 12. Both a total number of the complete blue sub-pixels 13 and a total number of the complete white sub-pixels 14 are less than the total number of the complete red sub-pixel 11 or the total number of the complete green sub-pixel 12, and are substantially a half of the total number of the complete red sub-pixels 11 or the complete green sub-pixels 12. The plurality of red sub-pixels 11 is arranged in a plurality of columns each extending in the first direction, as indicated by D1 shown in FIG. 1. Each column of red sub-pixels 11 includes no other color sub-pixel, and the complete red sub-pixels 11 in each column of red sub-pixels 11 are arranged one by one in the first direction D1. The plurality of green sub-pixels 12 are arranged in a plurality of columns each extending in the first direction, as indicated by D1 shown in FIG. 1. Each column of green sub-pixels 12 includes no other color sub-pixel, and the complete green sub-pixels 12 in each column of green sub-pixels 12 are arranged one by one in the first direction D1. The plurality of blue sub-pixels 13 and the plurality of white sub-pixels 14 are mixed and arranged in a plurality of columns each including both blue sub-pixels 13 and white sub-pixels 14 and extending in the first direction D1. Each column of blue sub-pixels 13 and white sub-pixels 14 includes no other color sub-pixel, and the blue sub-pixels 13 and the white sub-pixels 14 in each column are alternately arranged in the first direction D1. The plurality of columns of red sub-pixels 11, the plurality of columns of green sub-pixels 12, the plurality of columns of blue sub-pixels and white sub-pixels are alternately and periodically arranged in a second direction, as indicated by D2 shown in FIG. 1. The second direction D2 intersects with the first direction D1. In this embodiment, the second direction D2 is perpendicular to the first direction D1.

In this embodiment, as shown in FIG. 1, each complete red sub-pixel 11, each complete green sub-pixel 12, each complete blue sub-pixel 13, and each complete white sub-pixel 14 are substantially rectangular, and have substantially a same shape and a same size. In other embodiments, the shape and size of each color sub-pixel may be other shapes.

As shown in FIG. 1, the complete red sub-pixels 11 and the complete green sub-pixels 12 are arranged in a plurality of rows each in the second direction D2. In each row containing complete red sub-pixels 11 and complete green sub-pixels 12, a plurality of half-sized blue sub-pixels 13 and a plurality of half-sized white sub-pixels 14 are arranged. In each row containing complete red sub-pixels 11 and complete green sub-pixels 12, the complete red sub-pixels 11 and the complete green sub-pixels 12 are alternately arranged in the second direction D2. Each complete red sub-pixel 11 and one green sub-pixel 12 are adjacent to each other and are aligned with each other in the first direction D1. In each row containing complete red sub-pixels 11 and complete green sub-pixels 12, each complete green sub-pixel 12 is adjacent to one complete blue sub-pixel 13 and one complete white sub-pixel 14, but is not aligned with its adjacent one complete blue sub-pixel 13 or adjacent one complete white sub-pixel 14 in the first direction D1. Each green sub-pixel corresponds to one half-sized blue sub-pixel 13 and one half-sized white sub-pixel 14. In each row containing complete red sub-pixels 11 and complete green sub-pixels 12, the complete red sub-pixels 11, the complete green sub-pixels 12, and a plurality of combinations each containing a half-sized blue sub-pixel 13 and a half-sized white sub-pixel 14 are alternately and periodically arranged in the second direction D2.

The arrangement of the sub-pixels is not limited to that shown in FIG. 1, and may also be adjusted by reversing positions of the complete red sub-pixels 11 and the complete green sub-pixels 12, and reversing positions of the half-sized blue sub-pixels 13 and the half-sized white sub-pixels 14.

In this embodiment, if all of the complete red sub-pixels 11 and all of the complete green sub-pixels 12 are removed, all of the complete white sub-pixels 14 would be arranged spaced apart from each other and in a plurality of rows each extending in the second direction D2 shown in FIG. 1. Similarly, all of the blue sub-pixels 13 would be arranged spaced apart from each other and in a plurality of rows each extending in the second direction D2 shown in FIG. 1. Each row containing complete white sub-pixels 14 does not include any blue sub-pixel 13, and each row containing complete blue sub-pixels 13 does not include any white sub-pixel 14. The rows containing complete white sub-pixels 14 and the rows containing complete blue sub-pixels 13 are alternately arranged in the first direction D1. In addition, each row containing complete red sub-pixels 11 and complete green sub-pixels 12 is not aligned with any row containing complete blue sub-pixels 13 or any row containing complete white sub-pixels 14 in the first direction D1.

As shown in FIG. 1, the display panel 100 defines a plurality of pixel units 20. The plurality of pixel units 20 are arranged in a matrix. Each pixel unit 20 (shown by a dotted rectangular line) has a substantially rectangular shape. Each pixel unit 20 includes one complete red sub-pixel 11 and one complete green sub-pixel 12 adjacent to each other in a same row, and a half-sized blue sub-pixel 13 and a half-sized white sub-pixel 14, is half the size of a complete pixel and located adjacent to the complete red sub-pixel 11 or the complete green sub-pixel 12. That is, each complete blue sub-pixel 13 is shared by two adjacent pixel units 20 in the first direction D1, and each complete white sub-pixel 14 is shared by two adjacent pixel units 20 in the first direction D1.

FIG. 1 only shows pixel units 20 arranged in a 4×4 matrix, and numbers of rows and columns of the pixel units 20 is not be limited thereto.

Figure 2:
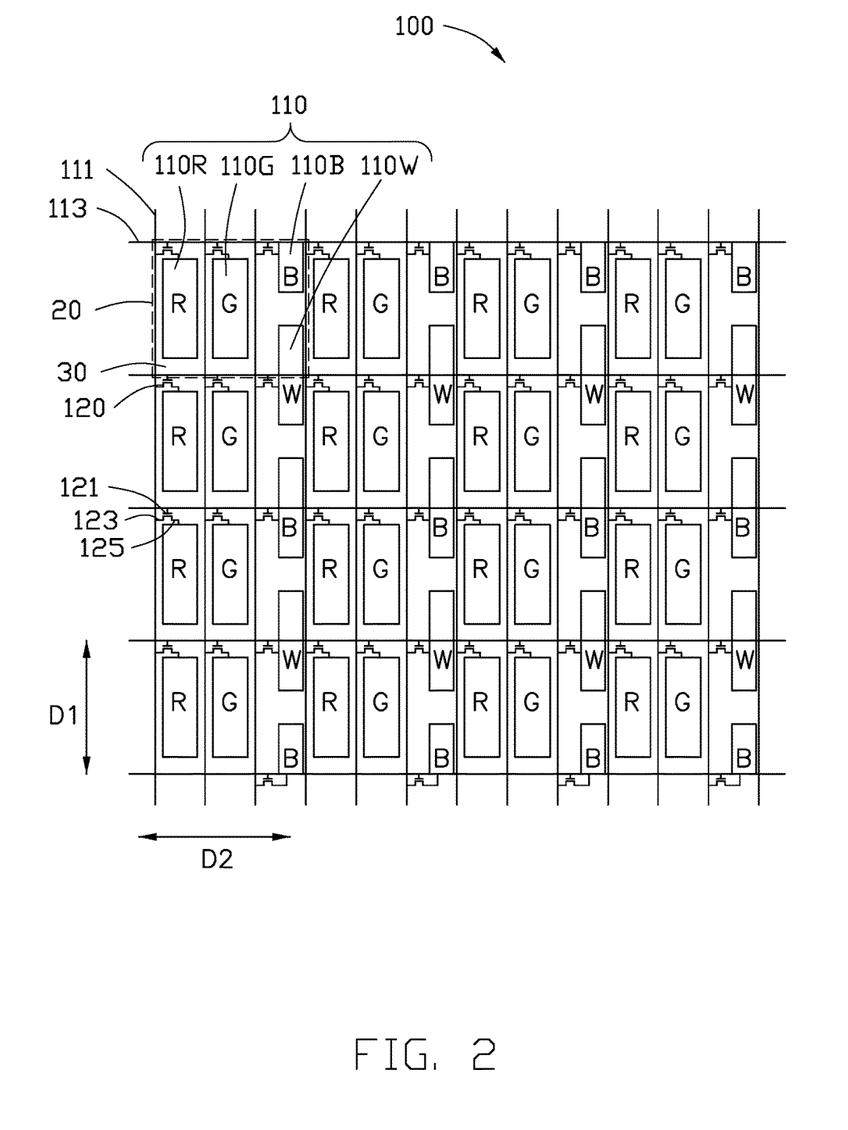
FIG. 2 is a view showing a pixel circuit of the display panel of FIG. 1.

Referring to FIG. 2, the display panel 100 includes a plurality of data lines 111 extending in the first direction D1 and a plurality of scan lines 113 extending in the second direction D2. Every two adjacent data lines 111 intersect with two adjacent scan lines 113 to define a sub-pixel region 30, thus the plurality of data lines 111 and the plurality of scan lines 113 cooperatively define a plurality of sub-pixel regions 30. Three adjacent sub-pixel regions 30 in the second direction D2 form a one pixel unit 20 described above. Each complete red sub-pixel 11 corresponds to one sub-pixel region 30. Each complete green sub-pixel 12 corresponds to one sub-pixel region 30. A half-sized blue sub-pixel 13 and a half-sized adjacent white sub-pixel 14 cooperatively corresponds to one sub-pixel region 30.

As shown in FIG. 2, the display panel 100 further includes a plurality of pixel electrodes 110. Each pixel electrode 110 corresponds to a color sub-pixel. The pixel electrode 110 corresponding to the complete red sub-pixel 11 is defined as a red pixel electrode 110R. The pixel electrode 110 corresponding to the complete green sub-pixel 12 is defined as a green pixel electrode 110G. The pixel electrode 110 corresponding to the complete blue sub-pixel 13 is defined as a blue pixel electrode 110B. The pixel electrode 110 corresponding to the complete white sub-pixel 14 is defined as a white pixel electrode 110W. Each complete red pixel electrode 110R is located in one sub-pixel region 30. Each green pixel electrode 110G is located in one sub-pixel region 30. Each complete blue pixel electrode 110B is located in two adjacent sub-pixel regions 30 in the first direction D1. Each complete white pixel electrode 110W is located in two adjacent sub-pixel regions 30 in the first direction D1.

The arrangement of the pixel electrodes 110 and arrangement of the sub-pixels are identical due to one-to-one correspondence between the pixel electrodes 110 and the sub-pixels. The arrangement of the sub-pixels has been described in detail above, the arrangement of the pixel electrodes 110 would not be repeatedly described.

As shown in FIG. 2, the complete blue pixel electrode 110B is penetrated by a projection of one scan line 113, the complete blue pixel electrode 110B being divided into two equal portions respectively belonging to two adjacent pixel units 20. The complete white pixel electrode 110W is penetrated by a projection of one scan line 113, the complete white pixel electrode 110W being divided into two equal portions respectively belonging to two adjacent pixel units 20.

Referring to FIG. 2, a thin film transistor (TFT) 120 is disposed in each sub-pixel region 30. Each TFT 120 includes a gate electrode 121, a source electrode 123, and a drain electrode 125. The gate electrode 121 of each TFT 120 is electrically coupled to one scan line 113, the source electrode 123 of each TFT 120 is electrically coupled to one data line 111, and the drain electrode 125 of each TFT 120 is electrically coupled to one color pixel electrode 110. Each complete red pixel electrode 110R is electrically coupled to the drain electrode 125 of one TFT 120 by a via hole, and each green pixel electrodes 110G is electrically coupled to the drain electrode 125 of one TFT 120 by a via hole. Since one blue sub-pixel 13 is shared by two adjacent pixel units 20 except for the blue sub-pixel 13 located at the outermost edge, each blue pixel electrode 110B is also shared by two adjacent pixel units 20. Each blue pixel electrode 110B shared by two adjacent pixel units 20 is electrically coupled to the drain electrode 125 of a same TFT 120 by a via hole, that is, each blue pixel electrode 110B is electrically coupled to a same TFT 120. Since one complete white sub-pixel 14 is shared by two adjacent pixel units 20 except for the complete white sub-pixel 14 located at the outermost edge, each white pixel electrode 110W is also shared by two adjacent pixel units 20. Each white pixel electrode 110W shared by two adjacent pixel units 20 is electrically coupled to the drain electrode 125 of a same TFT 120 by a via hole, that is, each white pixel electrode 110W is electrically coupled to one TFT 120.

Second Embodiment

Figure 3:
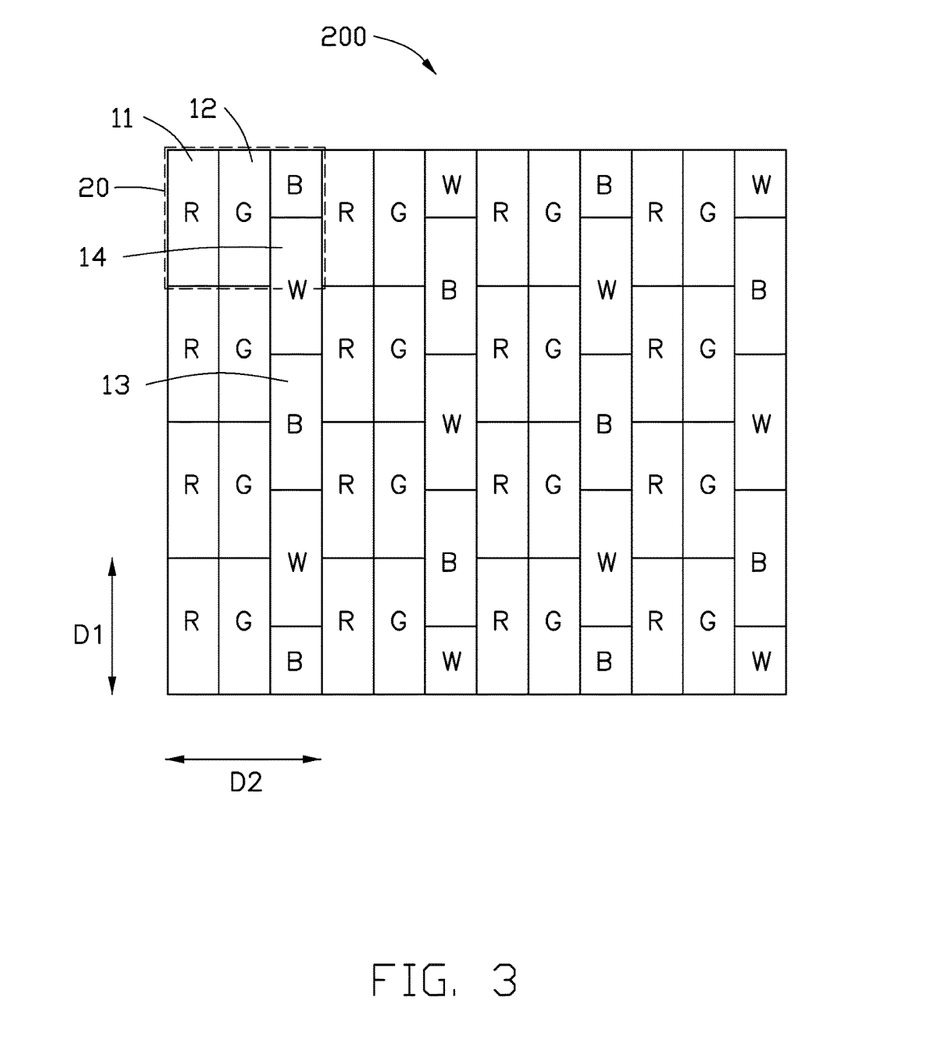
FIG. 3 is a plan view showing a layout of sub-pixels of a display panel according to a second embodiment.

FIG. 3 illustrates a display panel 200 according to a second embodiment. The display panel 200 includes a plurality of red sub-pixels 11, a plurality of green sub-pixels 12, a plurality of blue sub-pixels 13, and a plurality of white sub-pixels 14. The arrangement of the sub-pixels in the second embodiment is similar to that in the first embodiment, the only difference is that in the first embodiment, each row containing complete white sub-pixels 14 in the second direction D2 contains no blue sub-pixels 13, and each row containing complete blue sub-pixels 13 in the second direction D2 contains no white sub-pixels 14; in the second embodiment, each row containing complete white sub-pixels 14 in the second direction D2 contains blue sub-pixels 13, and the blue sub-pixel 13 and the complete white sub-pixels 14 are alternately arranged in each row.

In this embodiment, if all of the complete red sub-pixels 11 and all of the complete green sub-pixels 12 were removed, all of the complete white sub-pixels 14 and all of the complete blue sub-pixels 13 would be arranged in a plurality of rows each extending in the second direction D2 and in a plurality of columns each extending in the first direction D1 shown in FIG. 3. The complete blue sub-pixels 13 and the complete white sub-pixels 14 are alternately arranged in each row containing complete blue sub-pixels 13 and complete white sub-pixels 14.

The arrangement of the sub-pixels is not limited to that shown in FIG. 3, and may also be adjusted such as by reversing positions of the complete red sub-pixels 11 and the complete green sub-pixels 12, and reversing positions of the half-sized blue sub-pixels 13 and the half-sized white sub-pixels 14.

As shown in FIG. 3, the display panel 200 defines a plurality of pixel units 20. The plurality of pixel units 20 are arranged in a matrix. Each pixel unit 20 (shown by a dotted rectangular line) has a substantially rectangular shape. Each pixel unit 20 includes one complete red sub-pixel 11 and one complete green sub-pixel 12 adjacent to each other in a same row, and one half-sized blue sub-pixel 13 and one half-sized white sub-pixel 14 adjacent to the complete red sub-pixel 11 or the complete green sub-pixel 12. That is, each blue sub-pixel 13 is shared by two adjacent pixel units 20 in the first direction D1, and each white sub-pixel 14 is shared by two adjacent pixel units 20 in the first direction D1.

Figure 4:
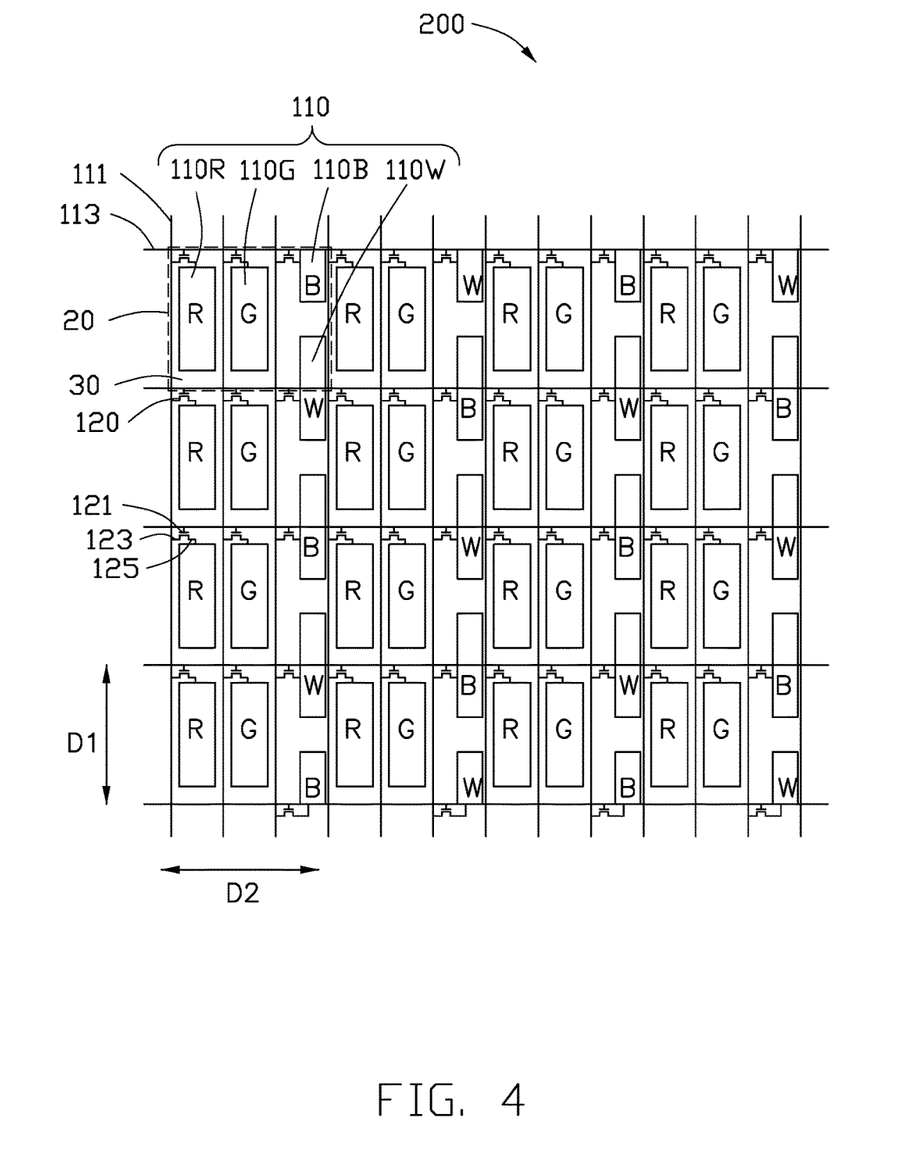
FIG. 4 is a view showing a pixel circuit of the display panel of FIG. 3.

Referring to FIG. 4, the display panel 200 includes a plurality of data lines 111 extending in the first direction D1 and a plurality of scan lines 113 extending in the second direction D2. Each two adjacent data lines 111 intersect with two adjacent scan lines 113 to define a sub-pixel region 30, the plurality of data lines 111 and the plurality of scan lines 113 thus cooperatively define a plurality of sub-pixel regions 30. Three adjacent sub-pixel regions 30 in the second direction D2 form a one pixel unit 20 described above. Each complete red sub-pixel 11 corresponds to one sub-pixel region 30. Each complete green sub-pixel 12 corresponds to one sub-pixel region 30. One half-sized blue sub-pixel 13 and one half-sized white sub-pixel 14 adjacent to each other cooperatively correspond to one sub-pixel region 30.

As shown in FIG. 4, the display panel 200 further includes a plurality of pixel electrodes 110. Each pixel electrode 110 corresponds to a color sub-pixel. The pixel electrode 110 corresponding to the complete red sub-pixel 11 is defined as a red pixel electrode 110R. The pixel electrode 110 corresponding to the complete green sub-pixel 12 is defined as a green pixel electrode 110G. The pixel electrode 110 corresponding to the blue sub-pixel 13 is defined as a blue pixel electrode 110B. The pixel electrode 110 corresponding to the complete white sub-pixel 14 is defined as a white pixel electrode 110W. Each complete red pixel electrode 110R is located in one sub-pixel region 30. Each complete green pixel electrode 110G is located in one sub-pixel region 30. Each complete blue pixel electrode 110B is located in two adjacent sub-pixel regions 30 in the first direction D1. Each complete white pixel electrode 110W is located in two adjacent sub-pixel regions 30 in the first direction D1. Arrangement of the pixel electrodes 110 and arrangement of the sub-pixels are identical due to one-to-one correspondence between the pixel electrodes 110 and the sub-pixels. The arrangement of the sub-pixels has been described in detail above, and arrangement of the pixel electrodes 110 would not be repeatedly described.

As shown in FIG. 4, the complete blue pixel electrode 110B is penetrated by a projection of one scan line 113 on the blue pixel electrode 110B; and the complete white pixel electrode 110W is penetrated by a projection of one scan line 113 on the white pixel electrode 110W.

Referring to FIG. 4, a TFT 120 is disposed in each sub-pixel region 30. Each TFT 120 includes a gate electrode 121, a source electrode 123, and a drain electrode 125. The gate electrode 121 of each TFT 120 is electrically coupled to one scan line 113, the source electrode 123 of each TFT 120 is electrically coupled to one data line 111, and the drain electrode 125 of each TFT 120 is electrically coupled to one color pixel electrode 110. Each complete red pixel electrode 110R is electrically coupled to the drain electrode 125 of one TFT 120 by a via hole, and each green pixel electrode 110G is electrically coupled to the drain electrode 125 of one TFT 120 by a via hole. Since complete blue sub-pixel 13 is shared by two adjacent pixel units 20, each blue pixel electrode 110B is also shared by two adjacent pixel units 20. Each blue pixel electrode 110B shared by two adjacent pixel units 20 is electrically coupled to the drain electrode 125 of a same TFT 120 by a via hole, that is, each blue pixel electrode 110B is electrically coupled to one TFT 120. Since each complete white sub-pixel 14 is shared by two adjacent pixel units 20, each white pixel electrode 110W is also shared by two adjacent pixel units 20. Each white pixel electrode 110W shared by two adjacent pixel units 20 is electrically coupled to the drain electrode 125 of a same TFT 120 by a via hole, that is, each white pixel electrode 110W is electrically coupled to one TFT 120.

Figure 5:
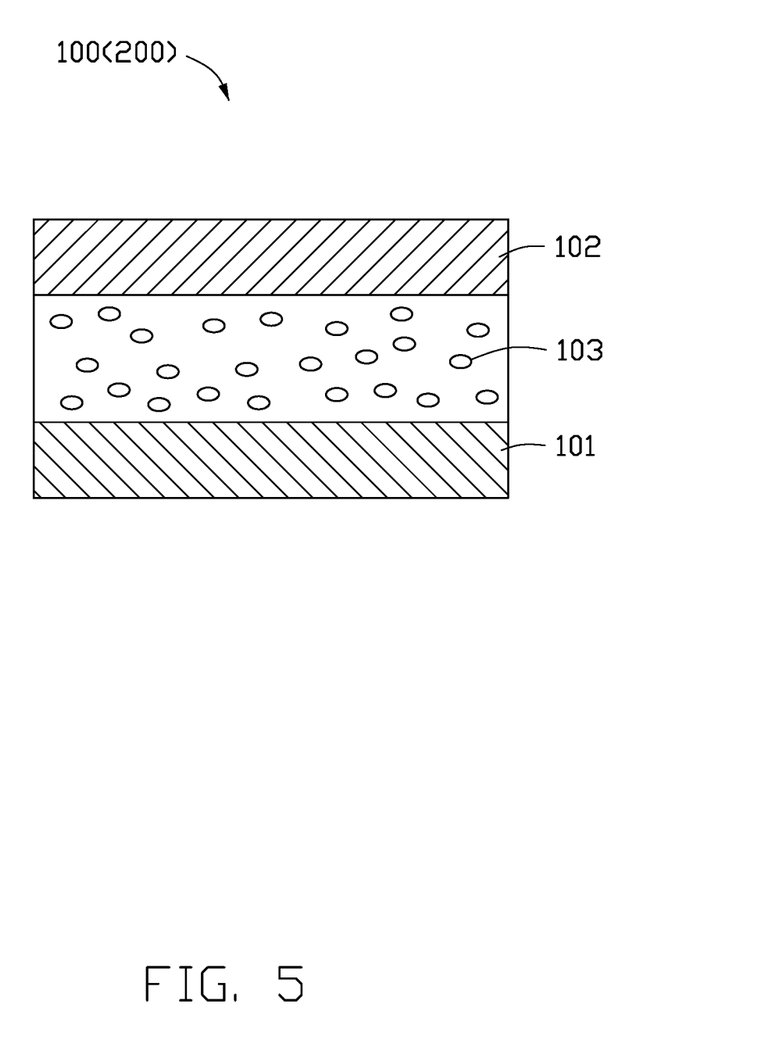
FIG. 5 is a cross-sectional view of a display panel according to an embodiment.

FIG. 5 shows that the display panels 100 and 200 are liquid crystal display panels. Such display panel includes a TFT array substrate 101, a color filter substrate 102 facing the TFT array substrate 101, and a liquid crystal layer 103 between the TFT array substrate 101 and the color filter substrate 102.

The display panels 100 and 200 are not limited to being liquid crystal display panels, and may be other display panels (e. g. OLED display panel or micro-LED display panel) as long as arrangement of the sub-pixels of the display panel meets the above requirements.

The arrangement of sub-pixels of different colors in this disclosure is designed to present as each one pixel unit having one half-sized blue sub-pixel and one half-sized white sub-pixel. The symmetry of the blue sub-pixels and the white sub-pixels in adjacent pixel units is better; the problem of image artifacts is avoided.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A display panel, comprising:
a plurality of complete red sub-pixels;
a plurality of complete green sub-pixels;
a plurality of complete blue sub-pixels; and
a plurality of complete white sub-pixels;
the plurality of complete red sub-pixels arranged in a plurality of columns, each column in a first direction;
the plurality of complete green sub-pixels arranged in a plurality of columns, each column in the first direction;
the plurality of complete blue sub-pixels and the plurality of complete white sub-pixels arranged in a plurality of columns, each column comprising the complete blue sub-pixels and the complete white sub-pixels alternately arranged in the first direction;
wherein the plurality of columns of red sub-pixels, the plurality of columns of green sub-pixels, the plurality of columns of blue sub-pixels and white sub-pixels are alternately arranged in a second direction; the second direction intersects with the first direction;
the display panel defining a plurality of pixel units;
wherein each of the plurality of pixel units comprising one complete red sub-pixel and one complete green sub-pixel adjacent to each other, and a half-sized blue sub-pixel and a half-sized white sub-pixel adjacent to the one complete red sub-pixel or the one complete green sub-pixel;
the display panel further comprises a plurality of data lines extending in the first direction and a plurality of scan lines extending in the second direction; wherein the plurality of data lines and the plurality of scan lines cooperatively define a plurality of sub-pixel regions; three of the plurality of sub-pixel regions adjacent in the second direction form one of the plurality of pixel units; each of the plurality of complete red sub-pixels corresponds to one of the plurality of sub-pixel regions; each of the plurality of complete green sub-pixels corresponds to one of the plurality of sub-pixel regions; a half-sized blue sub-pixel and a half-sized white sub-pixel adjacent to each other cooperatively corresponds to one of the plurality of sub-pixel regions;
the display panel further comprises a TFT disposed in each of the plurality of sub-pixel regions; each TFT comprises a gate electrode, a source electrode, and a drain electrode; and
the display panel further comprises a plurality of pixel electrodes, wherein each of the plurality of pixel electrodes one to one corresponds to each color sub-pixel and is directly connected to only one TFT; the pixel electrode corresponding to one complete red sub-pixel is defined as a red pixel electrode; the pixel electrode corresponding to one complete green sub-pixel is defined as a green pixel electrode; the pixel electrode corresponding to one complete blue sub-pixel is defined as a blue pixel electrode; the pixel electrode corresponding to one complete white sub-pixel is defined as a white pixel electrode; each red pixel electrode is located only within one of the plurality of sub-pixel regions; each green pixel electrode is located only within one of the plurality of sub-pixel regions; each blue pixel electrode is located in two adjacent sub-pixel regions in the first direction; each white pixel electrode is located in two adjacent sub-pixel regions in the first direction.

2. The display panel of claim 1, wherein the plurality of complete red sub-pixels and the plurality of complete green sub-pixels are alternately arranged in a plurality of rows, each row in the second direction; each row contains the complete red sub-pixels and the complete green sub-pixels, each of the complete red sub-pixels and each of the complete green sub-pixels are aligned with each other, each of the complete red sub-pixels or each of the complete green sub-pixels corresponds to the half-sized blue sub-pixel and the half-sized white sub-pixel.

3. The display panel of claim 1, wherein the plurality of complete white sub-pixels are arranged spaced apart from each other and in a plurality of rows each extending in the second direction; the plurality of complete blue sub-pixels are arranged spaced apart from each other and in a plurality of rows each extending in the second direction; each row containing complete white sub-pixels contains no blue sub-pixel; each row containing complete blue sub-pixels contains no white sub-pixel.

4. The display panel of claim 3, wherein the rows containing complete white sub-pixels and the rows containing complete blue sub-pixels are alternately arranged one by one in the first direction.

5. The display panel of claim 1, wherein the plurality of complete white sub-pixels and the plurality of complete blue sub-pixels are arranged in a plurality of rows each extending in the second direction; the complete blue sub-pixels and the complete white sub-pixels are alternately arranged in each row containing the complete blue sub-pixels and the complete white sub-pixels.

6. The display panel of claim 1, wherein each complete blue pixel electrode is penetrated by a projection of one of the plurality of scan lines on the complete blue pixel electrode; each complete white pixel electrode is penetrated by a projection of one of the plurality of scan lines on the complete white pixel electrode.

7. The display panel of claim 6, wherein the gate electrode of each TFT is electrically coupled to one of the plurality of scan lines, the source electrode of each TFT is electrically coupled to one of the plurality of data lines, and the drain electrode of each TFT is electrically coupled to one color pixel electrode.

8. The display panel of claim 7, wherein each blue pixel electrode is shared by two adjacent pixel units and is electrically coupled to the drain electrode of a same TFT; each white pixel electrode is shared by two adjacent pixel units and is electrically coupled to the drain electrode of a same TFT.

* * * * *